United States Patent [19]

Maruyama et al.

[11] Patent Number: 4,949,304

[45] Date of Patent: Aug. 14, 1990

[54] BLOCH LINE MEMORY DEVICE

[75] Inventors: Youji Maruyama, Iruma; Tadashi Ikeda, Tsukui; Ryo Suzuki, Hachioji, all of Japan

[73] Assignee: Hitachi, Ltd., Tokyo, Japan

[21] Appl. No.: 241,731

[22] Filed: Sep. 8, 1988

[30] Foreign Application Priority Data

Sep. 16, 1987 [JP] Japan .................................. 62-22950

[51] Int. Cl.$^5$ ............................................. G11C 19/08
[52] U.S. Cl. ........................................ 365/87; 365/29
[58] Field of Search .................................... 365/29, 87

[56] References Cited

U.S. PATENT DOCUMENTS

4,731,752  3/1988  Hidaka .................................. 365/87

Primary Examiner—James W. Moffitt
Attorney, Agent, or Firm—Pennis & Edmonds

[57] ABSTRACT

In a Bloch line memory device, information corresponds to the presence or absence of a Bloch line pair present in the magnetic wall of a stripe magnetic domain. Reading of information is effected by converting the presence and absence of a Bloch line pair into the presence and absence of a magnetic bubble domain. The conversion is effected such that, after the stripe magnetic domain has been shrunk in such a manner that no Bloch line is present therein, a magnetic field for chopping off the stripe magnetic domain is applied to the shrunken portion. Thus, when a Bloch line is present at an end portion of the stripe magnetic domain, the stripe magnetic domain is chopped off to form a magnetic bubble domain, whereas, when no Bloch line is present at the end portion of the stripe magnetic domain, the stripe magnetic domain is not chopped off and therefore no magnetic bubble domain is formed. Whether the magnetic bubble domain is present or absent is processed as information.

7 Claims, 5 Drawing Sheets

BLOCH LINE MEMORY DEVICE

BACKGROUND OF THE INVENTION

1. Field of the Invention

The present invention relates to a magnetic memory device and, more particularly, to a Bloch line memory device which employs as an information carrier a vertical Bloch line that is a microstructure of domain wall present in a magnetic wall which surrounds a stripe magnetic domain in a thin ferromagnetic film (thin magnetic garnet film).

2. Description of the Related Art

Figure 1:
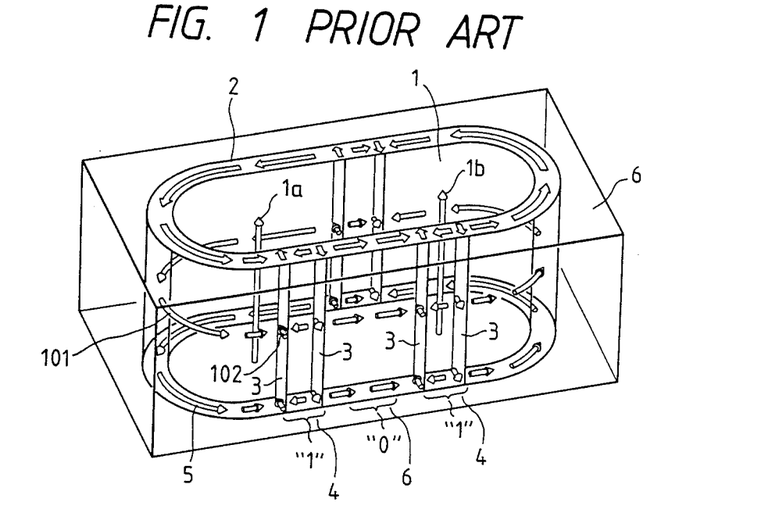
FIGS. 1 and 2A to 2D are views employed to describe a prior art.

Like magnetic bubble memory devices, Bloch line memory devices use a magnetic garnet film as a memory medium film. However, these two types of memory device greatly differ from each other in terms of the information storing method. More specifically, in the conventional magnetic bubble memory devices, the presence and absence of a magnetic domain are arranged to correspond to information "1" and "0", respectively, whereas, in the Bloch line memory devices, the presence and absence of a vertical Bloch line pair in the magnetic wall surrounding a stripe magnetic domain formed by stretching a bubble domain are arranged to correspond to information "1" and "0", respectively. FIG. 1 shows the arrangement of a Bloch line memory device according to a prior art. In FIG. 1, the upward arrows 1a and 1b within a strip magnetic domain 1 denote the direction of magnetization, while the arrow 101 on the center line of a magnetic wall 2 denotes the direction of magnetization of the center line, and the arrow 102 which is perpendicular to the center line of the magnetic wall 2 denotes the direction of magnetization of the center of each vertical Bloch line 3 (hereinafter referred to simply as "Bloch line"). A portion 4 where a pair of Bloch lines 3 are present corresponds to the information "1", whereas, a portion 6 where no Bloch line 3 is present corresponds to the information "0".

The Bloch line that is employed as an information carrier is a microstructure of domain wall which is present in the magnetic wall 2 surrounding the stripe magnetic domain 1. The Bloch line 3 is stably present in the magnetic wall 2 and freely movable therein. Accordingly, if a multiplicity of stripe magnetic domains 1 are disposed in parallel at predetermined positions and Bloch lines 3 are allowed to be present within the magnetic walls 2, the Bloch lines 3 show behavior such as that of bubble domains moving through minor loops of a magnetic bubble memory device. Therefore, a Bloch line memory device can be used to arrange a memory device in the form of a shift register in the same way as in the case of a magnetic bubble memory device.

The presence of Bloch line has been known for a long time and it has been experimentally and analytically proved that the presence of Bloch lines decreases the speed of movement of magnetic domains. For this reason, in magnetic bubble memory devices in which magnetic domains must be moved, a bubble domain which includes a Bloch line is called a hard bubble and measures have been taken to prevent generation of Bloch lines. In contrast, in Bloch line memory devices, the presence of Bloch lines is positively utilized.

The physical size of a Bloch line is about 1/10 of the width of a stripe magnetic domain in which it is present, and a multiplicity of Bloch lines are allowed to be present within a single stripe magnetic domain. For example, in the case of a magnetic garnet film with a stripe magnetic domain width of 1 $\mu$m which is presently developed for magnetic bubble memory devices, about $5 \times 10^8$ Bloch lines are allowed to be present per $cm^2$. Accordingly, if two Bloch lines are paired to form an information carrier, it is possible to produce a memory device of 256 Mbit/$cm^2$ in capacity.

There is the following reason for Bloch lines to enable realization of a large memory capacity in addition to the advantage that the size thereof is very small. More specifically, in the magnetic bubble memory, the in-plane field is rotated to propagate information carriers, whereas, in the Bloch line memory, a perpendicular field is employed to propagate information. Accordingly, the propagation track pattern is planar and simple, which facilitates achievement of a high density of the device.

As has been described above, Bloch lines are freely movable around a stripe magnetic domain and capable of storing information. However, it is necessary in order to form a memory device to realize writing and reading of information.

As to a method of writing information, it is generally well known practice to supply a current to conductors disposed at an end of a stripe magnetic domain so as to apply a local field to the end portion of the stripe magnetic domain to thereby invert 180° the direction of magnetization. In other words, it may be considered that the state of magnetization denoted by "0" in FIG. 1 is inverted to the state of the region "1". At this time, magnetization continuously changes at the boundary between an inverted region and a non-inverted region and therefore a state wherein the direction of magnetization is at 90° with respect to the magnetic wall is produced. This is a Bloch line. It should be noted that since a pair of Bloch lines are infallibly produced, information "1" and information "0" are arranged to correspond to the presence and absence of a pair of Bloch lines.

Figure 2A:
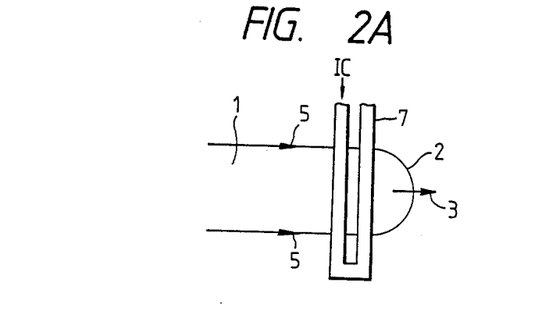
Figure 2B:
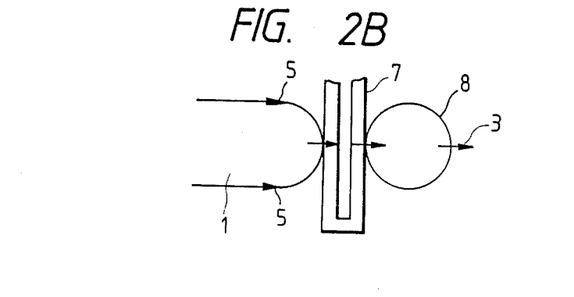
Figure 2C:
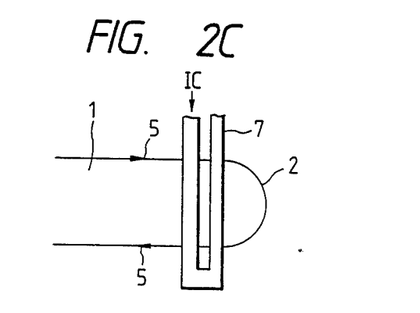
Figure 2D:
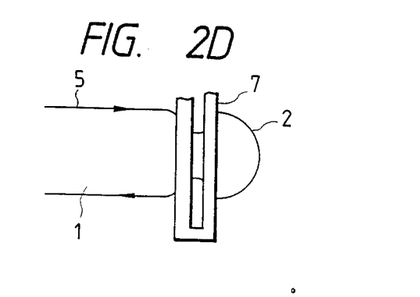

Reading of information is carried out after conversion of the presence or absence of a vertical Bloch line pair into the presence or absence of a bubble domain. The conversion from Bloch lines into bubble domains is effected using the method disclosed by Konishi in IEEE Trans, MAG19, No. 5 (1983), pp. 1838–1843. This method will be explained with reference to FIGS. 2A to 2D. When a Bloch line 3 is present in a magnetic wall 2 surrounding a stripe magnetic domain 1, the direction of magnetization within the magnetic wall 2 is inverted at the Bloch line 3, that is, the direction of magnetization at one side of the Block line 3 is reverse to that at the other side of the Bloch line 3. Such a change in the structure of domain wall leads to a difference in terms of easiness with which the end portion of the magnetic domain is chopped between the case where one Bloch line 3 has moved to the end portion of the stripe magnetic domain 1 as shown in FIG. 2A and the case where no Bloch line is present at the end portion of the stripe magnetic domain 1 as shown in FIG. 2C. More specifically, only when one Bloch line is present at the end portion of the stripe magnetic domain 1 as shown in FIG. 2A, a bubble domain 8 can be chopped off from the end portion of the stripe magnetic domain 1 as shown in FIG. 2B by supplying a predetermined current Ic to parallel conductors (chopping conductors) 7 which are provided over the end portion of the stripe magnetic domain 1. When no Bloch line 3 is present at the end portion of the stripe magnetic domain 1 as shown in FIG. 2C, the bubble domain cannot be chopped off even if the current Ic is supplied to the chopping conductors 7. If the bubble domain 8 chopped off as shown in FIG. 2B is propagated and converted into an electric signal by a method similar to that used for the major line of a bubble memory device, information corresponding to the presence of a Bloch line can be read out.

Sections that realize the respective functions of writing, storing and reading information as described above are formed on the same one device to realize a Bloch line memory device.

It should be noted that the above-described writing and reading operations are described in U.S. Pat. No. 4,583,200.

In the above-described prior art, chopping of a new magnetic domain is effected by supplying two parallel conductors with current pulses reverse to each other. However, a new bubble magnetic domain 8 is chopped off only when a Bloch line 3 is present at a longitudinal end portion of the stripe magnetic domain (memory section) which intersects the parallel conductors 7 at substantially right angles. The presence and absence of the bubble domain 8 correspond to the presence and absence of a Bloch line which are, in turn, arranged to correspond to information "1" and "0", respectively. The presence of a bubble domain 8 is detected by a detecting method employed in the existing magnetic bubble memory devices. In this way, information carried by a Bloch line is read out.

However, the above-described prior art mentions nothing about the waveform of current pulses supplied to the parallel conductors to chop off a magnetic domain. Further, the experiment conducted by the present inventors has revealed that a mal-operation is likely to occur when a magnetic domain is chopped off simply by supplying rectangular pulses to the parallel conductors 7 (hereinafter referred to as "chopping conductors") and the operating range thereof is narrow. The contents of the experiment will be explained hereinunder with reference to the drawings.

Figure 3:
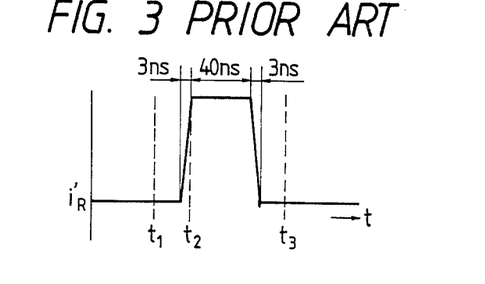
FIG. 3 is a chart showing the waveform of a current pulse employed in the prior art.

FIG. 3 is a chart showing the waveform of a current pulse $i'_R$ supplied to chop off the stripe magnetic domain 1. The pulse rise time is 3 nsec, while the pulse width is 40 nsec, and the pulse fall time is 3 nsec. As has been described with reference to FIG. 2, the easiness with which the end portion of the stripe magnetic domain 1 is chopped off in the case where a Bloch line 3 is present at the end portion of the stripe magnetic domain 1 (FIG. 2A) differs from that in the case where no Bloch line 3 is present (FIG. 2C). More specifically, when a Bloch line 3 is present at the end portion of the stripe magnetic domain 1 (FIG. 2A), the directions of magnetization 5 of the opposing magnetic walls 2 are the same as each other. On the other hand, when no Bloch line 3 is present (FIG. 2C), the directions of magnetization 5 of the opposing magnetic walls 2 are opposite to each other. For this reason, when the opposing magnetic walls 2 come close to each other in the process of chopping off a magnetic domain, there is a difference in the exchange interaction taking place between the magnetizations of the magnetic walls. Therefore, a magnetic domain can be chopped off only when a Bloch line 3 is present (i.e., the directions of magnetizations of the opposing magnetic walls 2 are the same). By utilizing this nature, it is possible to convert the presence and absence of a Bloch line into the presence and absence of a bubble magnetic domain (i.e., a magnetic domain chopped off from the stripe magnetic domain). However, an experiment conducted by the present inventors has revealed that there is a case where the phenomenon which is opposite to the above occurs. This will next be explained with reference to FIG. 4.

Figure 4:
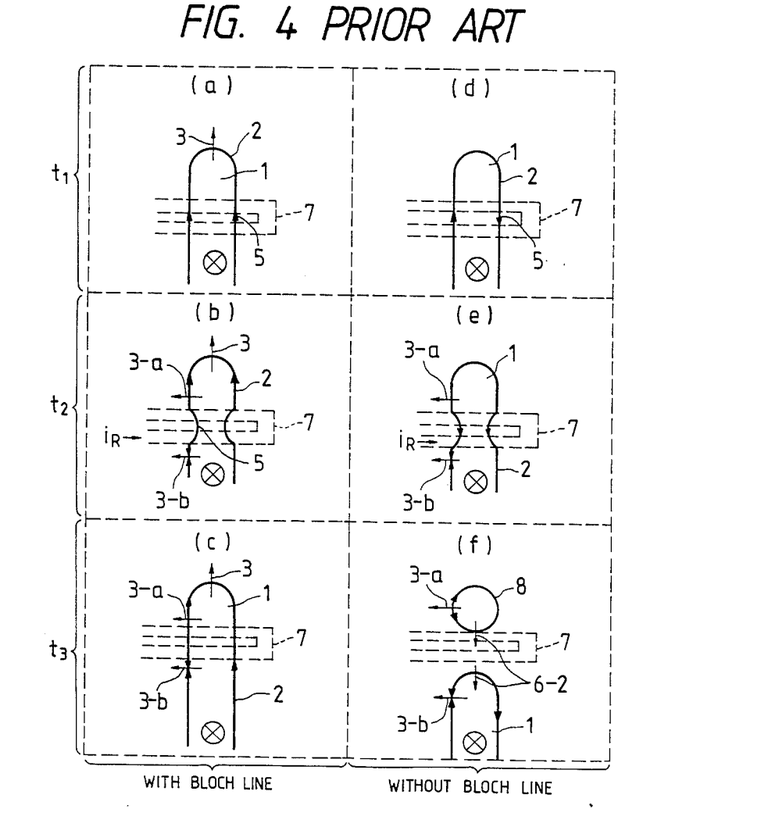
FIGS. 4(a) to 4(f) are schematic views employed to describe problems of the prior art.

Like FIG. 2, FIG. 4 shows a case where a Bloch line 3 is present at the end portion of a stripe magnetic domain 1 [FIGS. 4(a), 4(b) and 4(c)] and a case where no Bloch line is present [FIGS. 4(d), 4(e) and 4(f)]. The present inventors have found a possibility of a mal-operation that the stripe magnetic domain 1 cannot be chopped off when a Bloch line 3 is present but it is chopped off when no Bloch line 3 is present instead. This mal-operation is caused due to the fact that, when the current pulse $i'_R$ shown in FIG. 3 is applied (t=t2), new Bloch lines 3-a and 3-b are generated as shown in FIG. 4(b), thus causing the direction of magnetization 5 of the magnetic wall 2 to be inverted. If the direction of magnetization 5 is inverted, the degree of easiness with which the stripe magnetic domain is chopped off and which is determined according to whether a Bloch line 3 is present or absent is inverted, as will be clear from FIGS. 5(b) and 5(e). For this reason, the above-described mal-operation is caused. This is because the shrinkage of the stripe magnetic domain 1 and the chopping operation take place for a short period of time (substantially simultaneously) since the rise of the current pulse $i'_R$ is steep.

To prevent the mal-operation, it suffices to cause the stripe magnetic domain to shrink under conditions where the Bloch lines 3-a and 3-b are not generated. However, it is necessary to set the current value at a relatively high level in order to chop off the magnetic domain by means of a current pulse in the prior art, and Bloch lines are generally generated at a current value approximately equal to the value of the current pulse for chopping. Accordingly, there is a considerably high probability that a mal-operation will take place at the time of chopping off a magnetic domain.

SUMMARY OF THE INVENTION

It is a primary object of the present invention to provide a Bloch line memory device which is designed so that it is possible to realize chopping of an end portion of a stripe magnetic domain without a fear of the above-described mal-operation and hence obtain excellent operating characteristics.

The above-described object is attained by chopping off a stripe magnetic domain after it has previously been shrunk so that no Bloch line is generated therein.

If a current pulse having a gentle rise is applied to the chopping conductors, the magnetic domain gradually thins and thus shrinks. If the pulse rise time is set so as to be longer than 100 nsec (in the case where the magnetic domain width is 5 μm), the direction of magnetization is kept tangential to the magnetic wall and therefore no Bloch line is generated. As a result, it is possible to bring a stripe magnetic domain into a shrunken state, that is, a readily choppable state (i.e., a thin state), without generating an unnecessary Bloch line. If this state is maintained, it is possible to chop off only a stripe magnetic domain which is to be chopped off simply by additionally applying a slight current pulse to the chopping conductors.

The present invention enables an end portion of a stripe magnetic domain to be chopped off without a fear of a mal-operation and permits enlargement of the operating range. Thus, it is possible to provide a Bloch line memory device having excellent operating characteristics.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

One embodiment of the present invention will be described hereinunder with reference to FIGS. 5 and 6.

Figure 5:
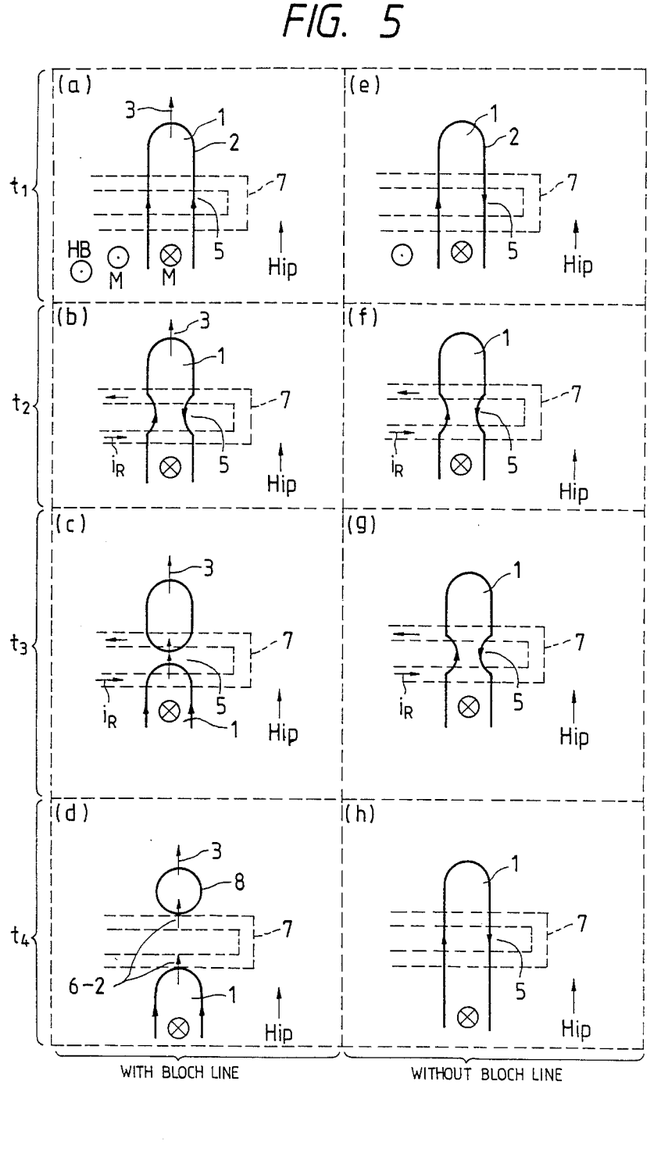
FIGS. 5(a) to 5(h) show in combination one embodiment of the present invention.
Figure 6:
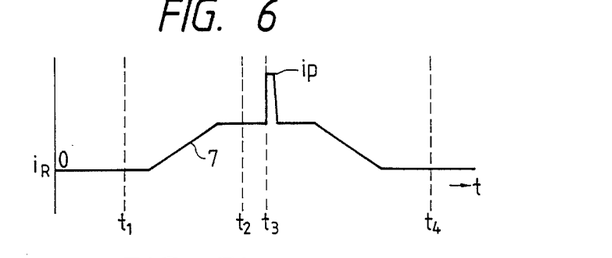
FIG. 6 is a chart showing the waveform of a current pulse employed in the embodiment shown in FIG. 5.

FIG. 5 schematically shows the way of chopping off a stripe magnetic domain in regard to the case where a Bloch line is present at the end portion of a stripe magnetic domain (i.e., with Bloch line) and also the case where no Bloch line is present (i.e., without Bloch line), as has already been described. FIG. 6 shows the waveform of a current pulse employed in the present invention.

In this embodiment, a CaGe garnet material having a saturated magnetic flux density of 200 G, a characteristic length of 0.6 $\mu$m and a film thickness of 3.5 $\mu$m was employed as a medium material. Chopping conductors 7 were made of Au such that each conductor has a width of 5 $\mu$m and a thickness of 0.5 $\mu$m. The gap between the chopping conductors 7 was set at 4 $\mu$m, while the spacing between the conductors 7 on the one hand and the medium film on the other was set at 1 $\mu$m.

First, after a predetermined device operation, a condition in which a Bloch line is present at the end portion [FIG. 5(a)] and a condition in which no Bloch line is present [FIG. 5(e)] are produced ($t=t_1$). Thereafter, a current pulse $i_R$ such as that shown in FIG. 6 is supplied to the chopping conductors 7. In consequence, a stripe magnetic domain 1 shrinks at a region thereof which is surrounded by the chopping conductors 7 ($t=t_2$), as shown in FIGS. 5(b) and 5(f). Thereafter, a chopping current pulse $i_P$ such as that shown in FIG. 6 is supplied to the chopping conductors 7 ($t=t_3$). The stripe magnetic domain 1 having a Bloch line 3 present at the end portion is chopped off, but the stripe magnetic domain 1 in which no Bloch line is present is not chopped off. As a result, a bubble domain 8 can be chopped off only when a Bloch line is present, as shown in FIGS. 5(d) and 5(h). Since the size of the current pulse additionally applied is smaller than that of the current pulse employed in the prior art, there is no fear of extra Bloch lines being generated as shown in FIG. 4. Thus, it is possible to prevent a mal-operation at the time of chopping off a stripe magnetic domain by chopping it off by means of a stepped (convex) current pulse according to the present invention.

Figure 7A:
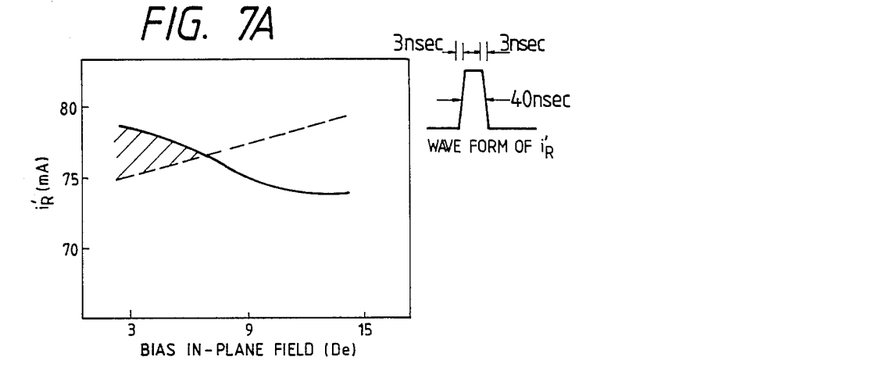
FIGS. 7A and 7B are charts showing the operating characteristics for converting the presence of a Bloch line into the presence of a bubble domain which are obtained by the prior art and the present invention, respectively.

The operating range of this embodiment will next be explained with reference to FIG. 7. FIG. 7A shows stripe magnetic domain chopping characteristics obtained by the prior art. The lower limit in the range within which a stripe magnetic domain having a Bloch line at the end portion thereof is chopped off is represented by the chain line, while the lower limit in the range within which a stripe magnetic domain having no Bloch line is chopped off is represented by the solid line. The figure shows the results of an experiment in which a bias in-plane field Hip for stabilizing the position of a Bloch line was varied. At a bias in-plane field of 3 Oe, the presence of a Bloch line can be converted into the presence of a bubble at a chopping current of 75 mA or more. However, a chopping current of 78 mA of more causes a magnetic domain to be chopped off to form a bubble even if no Bloch line is present. It will, therefore, be understood that the presence and absence of a Bloch line can be converted into the presence and absence of a bubble within a chopping current range of from 75 mA to 78 mA.

At a bias in-plane field of 9 Oe, the condition in which a stripe magnetic domain is chopped off according to whether a Bloch line is present or absent is inverted; therefore, it is impossible to convert the presence and absence of a Bloch line into the presence and absence of a bubble. Such a mal-operation has heretofore been caused in a device employing the prior art.

Figure 7B:
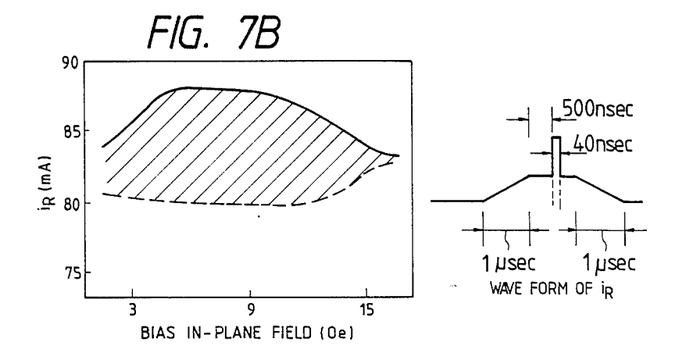
Figure 8A:
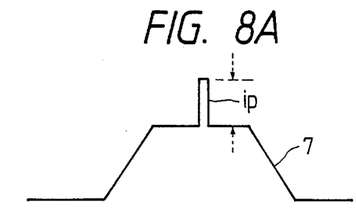
FIGS. 8A to 8F are charts showing the waveforms of current pulses employed in other embodiments of the present invention.
Figure 8B:
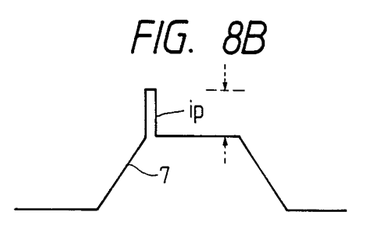
Figure 8C:
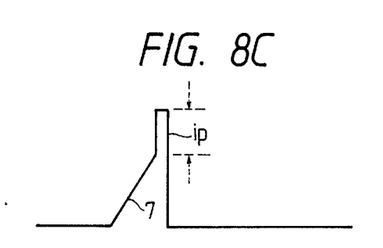
Figure 8D:
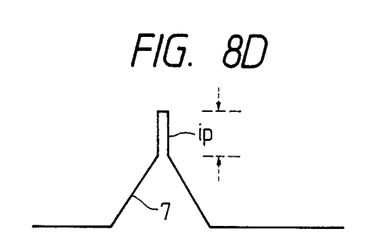
Figure 8E:
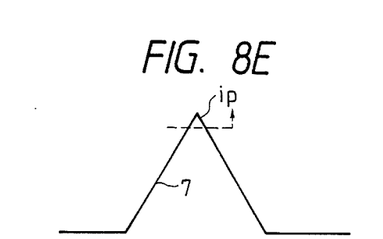
Figure 8F:
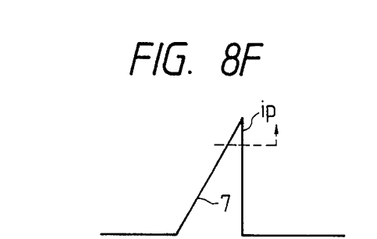

FIG. 7B shows the operating characteristics obtained when the present invention is practiced. The current pulse employed in this case comprises a current pulse $i_R$ 60 mA which has a rise time of 1 $\mu$sec and a chopping current pulse $i_P$ having a rise time of 3 nsec and a pulse width of 40 nsec, the chopping current pulse being added to the current pulse $i_R$. The phase of the chopping current pulse $i_P$ is shown at the right-hand side of FIG. 7B. It will be understood from the figure that it is possible to realize an operation under a high bias in-plane field and obtain enlarged operating characteristics. For example, at a bias in-plane field of 9 Oe, an excellent operation was realized within a range of from about 80 mA to about 88 mA.

It should be noted that the present invention may be applied not only to transmission of information from a memory section to a read section but also to a write function section. In the write function section, it is necessary to chop off an end portion of a stripe magnetic domain as in the case of a read operation in order to convert an unstable Bloch line pair into a stable Bloch line pair in the process of writing information. In this case also, one Bloch line is present at the end portion of the stripe magnetic domain and if unnecessary Bloch lines are generated during chopping process, a mal-operation may be caused. Application of the present invention to the write function section also enables prevention of a mal-operation and permits excellent operating characteristics to be obtained.

Although in this embodiment a composite current pulse which comprises two trapezoidal current pulses $i_R$ and $i_P$ is employed, the same advantages as those in this embodiment are obtained also using pulses having stepwisely increased current values. It is important that a magnetic domain should be chopped off with a relatively small current pulse after the magnetic domain has been thinned while preventing generation of Bloch lines which would otherwise cause a mal-operation.

As a means for previously thinning a magnetic domain, a bias field perpendicular to the surface of the medium film may be applied to the whole surface of the film. It is possible with this alternative arrangement also to obtain the same advantages as those in the above-described embodiment.

As to the means for partially applying the bias field, the chopping conductors are not necessarily needed to serve also a bias field application means as in the case of the above-described embodiment. For example, additional conductors may be installed in the vicinity of the chopping conductors. In this case also, it is possible to obtain the same advantages as those in the described embodiment.

Various current waveforms such as those shown in FIG. 8 may be employed for a means for applying a bias field, such as the chopping conductors 7 in the embodiment shown in FIG. 1 which also serve as a bias field application means. Although the waveform shown in FIG. 8A is the same as that shown in FIG. 6, when the current pulse shown in FIG. 8A was applied in such a manner that the phase of the chopping pulse $i_P$ was advanced to a point immediately after the rise of the chopping pre-processing pulse 7 as shown in FIG. 8B, there was no change in the advantages of the present invention. With the current pulse shown in FIG. 8C wherein the pre-processing pulse 7 after the application of the chopping pulse $i_P$ was cut off, it was possible to obtain excellent operating characteristics by virtue of the advantages of the present invention. Similarly, the present invention was realized without any problem by employing the waveform shown in FIG. 8D wherein the width of the pre-processing pulse 7 shown in FIG. 8A was reduced. Further, the present invention was realized without any problem even when the rate of rise of the chopping current pulse $i_P$ was made coincident with that of the pre-processing pulse 7 on the basis of the waveform shown in FIG. 8D (see FIG. 8E). Unlike the above-described waveforms, this waveform is triangular but gives rise to no problem in realization of the present invention. In other words, to realize an excellent stripe magnetic domain chopping operation, which is a primary object of the present invention, it suffices to chop off a stripe magnetic domain after it has been shrunk without generation of extra and unnecessary Bloch lines. Since the above-described waveforms have a gentle rise, the gyromagnetic force that acts on the magnetization of the magnetic wall is considerably small; therefore, there is no fear of a Bloch line being formed. The pulse rise time depends on the material employed. However, it is preferable to select a pulse rise time of from 70 nsec to 300 nsec for a magnetic domain width of 5 $\mu$m and from 7 nsec to 100 nsec for a magnetic domain width of 0.5 $\mu$m.

The pre-processing pulse 7 may be arranged to rise within the above-described rise time range. The amplitude of the pre-processing pulse 7 and that of the chopping pulse $i_P$ are preferably set so as to be approximately equal to each other. If the amplitude of the pre-processing pulse is narrower than that of the chopping pulse, i.e., about a half or less of the latter, the effectiveness of the pre-processing pulse decreases and a mal-operation may occur. The shorter the width of the chopping pulse, the better. In general, the width of the chopping pulse is preferably set at 10 to 100 nsec. In the case where the chopping pulse width is 10 nsec or less, the pulse amplitude must be set at a relatively high level, whereas, in the case where the chopping pulse width is 100 nsec or more, quasi-static horizontal Bloch lines are formed by the action of in-plane field produced by the chopping conductors 7. Therefore, in either case, a mal-operation occurs. Although there is no particular restriction on the conditions for the rise of the chopping pulse, if the rise is made gentle, the effective pulse width lengthens, resulting in a mal-operation.

Any current pulse waveform which satisfies the above-described conditions may be employed in addition to those shown in FIG. 8.

What is claimed is:

1. A Bloch line memory device comprising:
   a magnetic film for retaining a magnetic bubble domain;
   a plurality of stripe magnetic domains formed within said magnetic film, each stripe magnetic domain having a Bloch line pair as an information carrier in its magnetic wall;
   write means for writing said Block line pair into said stripe magnetic domain in accordance with information; and
   read means for reading out information by converting the presence and absence of a Bloch line pair in said stripe domain into the presence and absence of a magnetic bubble domain, said read means operating such that, after said strip magnetic domain has been shrunk by applying a bias magnetic field in a direction perpendicular to the plane of said magnetic film in such a manner that no Bloch line is generated therein, a magnetic field for chopping off the stripe magnetic domain is applied to the shrunken portion of said stripe magnetic domain, whereby, when a Bloch line is present at a longitudinal end portion of said stripe magnetic domain, said stripe magnetic domain is chopped off to form a magnetic bubble domain, whereas, when no Bloch line is present at the longitudinal end portion of said stripe magnetic domain, said stripe magnetic domain is not chopped off and therefore no magnetic bubble domain is formed.

2. A Bloch line memory device comprising:
   a magnetic film for retaining a magnetic bubble domain;
   a plurality of stripe magnetic domains formed within said magnetic film, each stripe magnetic domain having a Bloch line pair as an information carrier in its magnetic wall;
   means for writing said Bloch line pair into said stripe magnetic domain in accordance with information; and
   means for reading out information by converting the presence and absence of a Bloch line pair in said stripe magnetic domain into the presence and absence of a magnetic bubble domain, said read means having two parallel conductors provided over said magnetic film so as to intersect the longitudinal axis of said stripe magnetic domain at substantially right angles, and said read means operating such that currents which flow in opposite directions to each other are supplied to said parallel conductors, respectively, in such a manner that no Bloch line is generated within said stripe magnetic domain to thereby shrink said stripe magnetic domain and thereafter currents for chopping off said stripe magnetic domain which flow in opposite directions to each other are supplied to said parallel conductors, respectively, whereby, when a Bloch line is present at a longitudinal end portion of said stripe magnetic domain, said stripe magnetic domain is chopped off to form a magnetic bubble domain, whereas, when no Bloch line is present at the longitudinal end portion of said stripe magnetic domain, said stripe magnetic domain is not chopped off and therefore no magnetic bubble domain is formed.

3. In a Bloch line memory device which employs as a storage information unit a Bloch line pair formed within a magnetic wall surrounding a stripe magnetic domain which is present in a ferromagnetic film having an axis of easy magnetization which is perpendicular to the plane of the film, the improvement which is a characterized in that, after said stripe magnetic domain has been shrunk in such a manner that no Bloch line is generated therein, said stripe magnetic domain is chopped off to form a magnetic bubble.

4. A Bloch line memory device comprising:

a magnetic film for retaining a magnetic bubble domain;

a plurality of stripe magnetic domains formed within said magnetic film, each stripe magnetic domain having a Bloch line pair as an information carrier in its magnetic wall;

write means for writing said Bloch line pair into said stripe magnetic domain in accordance with information; and read means for reading out information by converting the presence and absence of a Bloch line pair in said stripe domain into the presence and absence of a magnetic bubble domain, said stripe means operating such that, after said stripe magnetic domain has been shrunk by applying a bias magnetic field in a direction perpendicular to the plane of said magnetic film in such a manner that no Bloch line is generated therein, a magnetic field for chopping off the stripe magnetic domain is applied to the shrunken portion of said stripe magnetic domain, wherein said magnetic field is effected by supplying pulse currents flowing in opposite directions to each other to two parallel conductors, respectively, which are disposed so as to intersect the longitudinal axis of said stripe magnetic domain at substantially right angles, whereby, when a Bloch line is present at a longitudinal end portion of said stripe magnetic domain, said stripe magnetic domain is chopped off to form a magnetic bubble domain, whereas, when no Bloch line is present at the longitudinal end portion of said stripe magnetic domain, said stripe magnetic domain is not chopped off and therefore no magnetic bubble domain is formed.

5. A Bloch line memory device according to claim 4, wherein the shrinkage of said magnetic stripe domain is effected by previously supplying said parallel conductors with a shrinkage current having such a pulse rise time that no Bloch line is generated in said stripe domain.

6. A Bloch line memory device comprising:

a magnetic film for retaining a magnetic bubble domain;

a plurality of stripe magnetic domains formed within said magnetic film, each stripe magnetic domain having a Bloch line pair as an information carrier in its magnetic wall;

write means for writing said Bloch line pair into said stripe magnetic domain in accordance with information; and read means for reading out information by converting the presence and absence of a Bloch line pair in said stripe domain into the presence and absence of a magnetic bubble domain, said stripe means operating such that, after said stripe magnetic domain has been shrunk by applying a bias magnetic field in a direction perpendicular to the plane of said magnetic film, wherein said bias magnetic field is effected by supplying shrinkage currents of a determined rise time flowing in opposite directions to each other to two parallel conductors, respectively, which are disposed so as to intersect the longitudinal axis of said stripe magnetic domain at substantially right angles and wherein said rise time is such that no Bloch line is generated in said stripe magnetic domain, a magnetic field for chopping off the stripe magnetic domain is applied to the shrunken portion of said stripe magnetic domain, wherein said magnetic field is effected by supplying pulse currents flowing in opposite directions to each other to said respective two parallel conductors such that the sum of said shrinkage currents and said pulse current is a convex pulse current, whereby, when a Bloch line is present at a longitudinal end portion of said stripe magnetic domain, said stripe magnetic domain is chopped off to form a magnetic bubble domain, whereas, when no Bloch line is present at the longitudinal end portion of said stripe magnetic domain, said stripe magnetic domain is not chopped off and therefore no magnetic bubble domain is formed.

7. A Bloch line memory device comprising:

a magnetic film for retaining a magnetic bubble domain;

a plurality of stripe magnetic domains formed within said magnetic film, each stripe magnetic domain having a Bloch line pair as an information carrier in its magnetic wall;

write means for writing said Bloch line pair into said stripe magnetic domain in accordance with information; and read means for reading out information by converting the presence and absence of a Bloch line pair in said stripe domain into the presence and absence of a magnetic bubble domain, said stripe means operating such that, after said stripe magnetic domain has been shrunk by applying a bias magnetic field in a direction perpendicular to the plane of said magnetic film, wherein said bias magnetic field is effected by supplying shrinkage currents of a determined rise time flowing in opposite directions to each other to two parallel conductors, respectively, which are disposed so as to intersect the longitudinal axis of said stripe magnetic domain at substantially right angles and wherein said rise time is such that no Bloch line is generated in said stripe magnetic domain, a magnetic field for chopping off the stripe magnetic domain is applied to the shrunken portion of said stripe magnetic domain, wherein said magnetic field is effected by supplying pulse currents flowing in opposite directions to each other to said respective two parallel conductors such that the sum of said shrinkage currents and said pulse current is a triangular pulse current, whereby, when a Bloch line is present at a longitudinal end portion of said stripe magnetic domain, said stripe magnetic domain is chopped off to form a magnetic bubble domain, whereas, when no Bloch line is present at the longitudinal end portion of said stripe magnetic domain, said stripe magnetic domain is not chopped off and therefore no magnetic bubble domain is formed.

* * * * *